United States Patent [19]
Heuer

[11] Patent Number: 5,663,968
[45] Date of Patent: Sep. 2, 1997

[54] MARGIN TEST METHOD AND APPARATUS FOR INTERGRATED SERVICES DIGITAL NETWORKS

[75] Inventor: Hans Heuer, Carlingford, Australia

[73] Assignee: H. Heuer Instruments Pty Ltd., Carlingfore, Australia

[21] Appl. No.: 356,239

[22] PCT Filed: Jun. 30, 1993

[86] PCT No.: PCT/AU93/00321

§ 371 Date: Dec. 14, 1994

§ 102(e) Date: Dec. 14, 1994

[87] PCT Pub. No.: WO94/00941

PCT Pub. Date: Jun. 1, 1994

[30] Foreign Application Priority Data

Jun. 30, 1992 [AU] Australia .................. PL3271

[51] Int. Cl.⁶ .................................. H04L 12/26
[52] U.S. Cl. .................................. 371/28
[58] Field of Search ............... 371/5.1, 5.4, 5.5, 371/15.1, 20.1, 20.4, 20.5, 28, 55; 370/5, 15, 13, 85.1, 100.1, 200, 241, 249; 375/221, 211, 317, 257, 318; 379/5, 27, 29; 326/30, 86, 90; 340/511, 514, 825.2, 825.14

[56] References Cited

U.S. PATENT DOCUMENTS

| | | | |
|---|---|---|---|
| 3,603,744 | 9/1971 | Krasin et al. | 370/71 |
| 5,010,544 | 4/1991 | Chang et al. | 370/13.1 |
| 5,023,869 | 6/1991 | Grover et al. | 370/84 |
| 5,091,920 | 2/1992 | Ikeda et al. | 375/76 |
| 5,128,962 | 7/1992 | Kerslake et al. | 345/7 |
| 5,179,577 | 1/1993 | Ilydis | 375/76 |

FOREIGN PATENT DOCUMENTS

| | | | |
|---|---|---|---|
| 2823837 | 12/1979 | Germany | H04B 3/48 |
| 967533 | 8/1964 | United Kingdom | H04L 29/31 |
| 1364956 | 8/1974 | United Kingdom | G01R 27/28 |
| 1455712 | 11/1976 | United Kingdom | G01R 29/26 |
| 2073549 | 10/1981 | United Kingdom | H04M 3/26 |

OTHER PUBLICATIONS

Patents Abstracts of Japan E–1308, p. 5, JP, A, 4–249935 (NEC Eng Ltd.) Sep. 4, 1992.

*Primary Examiner*—Robert W. Beausoliel, Jr.
*Assistant Examiner*—Stephen C. Elmore
*Attorney, Agent, or Firm*—Knobbe, Martens, Olson & Bear, LLP

[57] ABSTRACT

A method and apparatus is provided for analog indications of the proximity to failure of an integrated services digital network. Analog indications or figures-of-merit can include: 1) the tolerable increase in two-wire line attenuation, 2) the tolerable decrease in receiver sensitivity in a line termination unit, and 3) the tolerable decrease in receiver sensitivity in a network termination unit. The margin test apparatus of the present invention comprises a network termination unit including means for coupling a two-wire to a four-wire line, a first adjustable attenuator for adjustably attenuating a received signal, a second adjustable attenuator for adjustably attenuating a transmitted signal, and a failure detection means which monitors the received signal and is calibrated such that it detects a signal failure if the level of the received signal is less than a predetermined threshold level. Methods of the present invention are provided for determining a line margin, a line termination receiver margin, and a network termination receiver margin using the margin test apparatus. Generally, a two-wire line is coupled to a line termination unit or network termination unit which is placed in a test mode such that the transmitted signal is looped back to become the received signal. An initial or nominal signal level is measured, and then the first or second adjustable attenuator, as appropriate, is used to determine the corresponding failure level. The difference between the nominal and failure levels defines the value of the desired margin.

11 Claims, 2 Drawing Sheets

MARGIN TEST METHOD AND APPARATUS FOR INTERGRATED SERVICES DIGITAL NETWORKS

TECHNICAL FIELD

The present invention relates to test apparatus for integrated services digital networks, and more particularly to a test apparatus for measuring a set of margins, or proximities to failure, of a number of analogue transmission and reception parameters of two-wire lines and their associated termination units in integrated services digital networks.

BACKGROUND

Information relating to quality of service obtained from two-wire lines and their associated termination units in integrated services digital networks usually includes measurements of bit-error rates. Such information is digital in nature, and supplies little intuitive insight into the state of various components associated with the two-wire line. Specifically, from a measured bit-error rate for a two-wire line, particularly if the bit-error rate lies close to a normal range, it is very difficult to make meaningful inferences about the state of the line and how robust it would be if conditions such as temperature and humidity were to change. This is particularly important for technicians who are trying to locate intermittent faults which occur only under rare circumstances.

Probably of more interest to a technician involved in fault-finding and maintenance of such two-wire lines would be a set of analogue figures-of-merit. For a two-wire line terminated at a customer's premises in a network termination unit, and terminated at an exchange in a line termination unit, such a set could, for example, include any of the following: (a) the tolerable increase in two-wire line attenuation, (b) the tolerable decrease in receiver sensitivity in the line termination unit, and (c) the tolerable decrease in receiver sensitivity in the network termination unit.

Equipped with this possible set of figures for the two-wire line, the technician could easily determine whether a fault was present, or was likely to become apparent, in the two-wire line itself, the line termination unit, or the network termination unit.

Thus, it is desirable to provide a test apparatus for integrated services digital networks for providing analogue figures-of-merit which can help a technician to locate faults in two-wire lines and their associated termination units.

SUMMARY OF THE INVENTION

The present invention comprises a margin test method and apparatus for use in an integrated services digital network, the margin test apparatus comprising: a network termination unit including means for coupling a two-wire line to a four-wire line, the two-wire line carrying a composite signal, and the four-wire line carrying a transmitted signal and a received signal; a first adjustable attenuator for adjustably attenuating the received signal; and a second adjustable attenuator for adjustably attenuating the transmitted signal.

Preferably, the network termination unit further includes: a receiver for converting the received signal to a received data stream, the received signal having a level; and a transmitter for converting a transmitted data stream to the transmitted signal; and wherein the network termination unit is calibrated such that it is in a failure mode if the level of the received signal is less than a predetermined threshold level.

The failure mode may comprise a state in which the bit-error rate is greater than a preselected rate, or a state in which the network termination unit is not synchronised with a second unit, or a state in which communication between termination units is substantially unreliable.

Preferably, the network termination unit further comprises failure detection means for determining if the network termination unit is in the failure mode.

A method for determining a line margin using the margin test apparatus preferably comprises the steps of: coupling the two-wire line to a line termination unit; placing the line termination unit in a first test mode in which the transmitted signal is looped back through the line termination unit to become the received signal; measuring the level of the received signal to determine an initial reception level; varying the first adjustable attenuator through a plurality of settings so that the level of the received signal passes through a plurality of attenuated reception levels; monitoring the failure detection means for each of the plurality of settings, thereby determining a threshold setting corresponding to a line failure level such that the network termination unit is in the failure mode for substantially all attenuated reception levels which are less than the line failure level, and is not in the failure mode for substantially all attenuated reception levels which are greater than the line failure level; and measuring the attenuated reception level corresponding to the threshold setting of the first adjustable attenuator, thereby determining the line failure level; the difference between the initial reception level and the line failure level defining the line margin.

A method for determining a line termination receiver margin using the margin test apparatus preferably comprises the steps of: coupling the two-wire line to a line termination unit; placing the line termination unit in a first test mode in which the transmitted signal is looped back through the line termination unit to become the received signal; measuring the level of the transmitted signal to determine a nominal transmission level; varying the second adjustable attenuator through a plurality of settings so that the level of the transmitted signal passes through a plurality of attenuated transmission levels; monitoring the failure detection means for each of the plurality of settings, thereby determining a threshold setting corresponding to a line termination receiver failure level such that the network termination unit is in the failure level for substantially all attenuated transmission levels which are less than the line termination receiver failure level, and is not in the failure mode for substantially all attenuated transmission levels which are greater than the line termination receiver failure level; and measuring the attenuated transmission level corresponding to the threshold setting of the second adjustable attenuator, thereby determining the line termination receiver failure level; the difference between the nominal transmission level and the line termination receiver failure level defining the line termination receiver margin.

A method for determining a network termination receiver margin using the margin test apparatus preferably comprises the steps of: coupling the two-wire line to a network termination unit under test; placing the network termination unit under test in a second test mode in which the transmitted signal is looped back through the network termination unit under test to become the received signal, the transmitted signal having a level; measuring the level of the transmitted signal to determine a nominal local level; varying the second adjustable attenuator through a plurality of settings so that the level of the transmitted signal passes through a plurality of attenuated transmission levels; monitoring the failure detection means for each of the plurality of settings, thereby determining a threshold setting corresponding to a network termination receiver failure level such that the network termination unit is in the failure mode for substantially all attenuated transmission levels which are less than the network termination receiver failure, and is not in the failure mode for substantially all attenuated transmission levels which are greater than a the network termination receiver failure level; and measuring the level of the transmitted signal corresponding to the transition point to determine a network termination receiver failure level; the difference between the nominal local level and the network termination receiver failure level defining the network termination receiver margin.

BRIEF DESCRIPTION OF THE DRAWINGS

The invention will be described with reference to the accompanying figures in which.

DETAILED DESCRIPTION OF THE PREFERRED EMBODIMENTS

Figure 1:
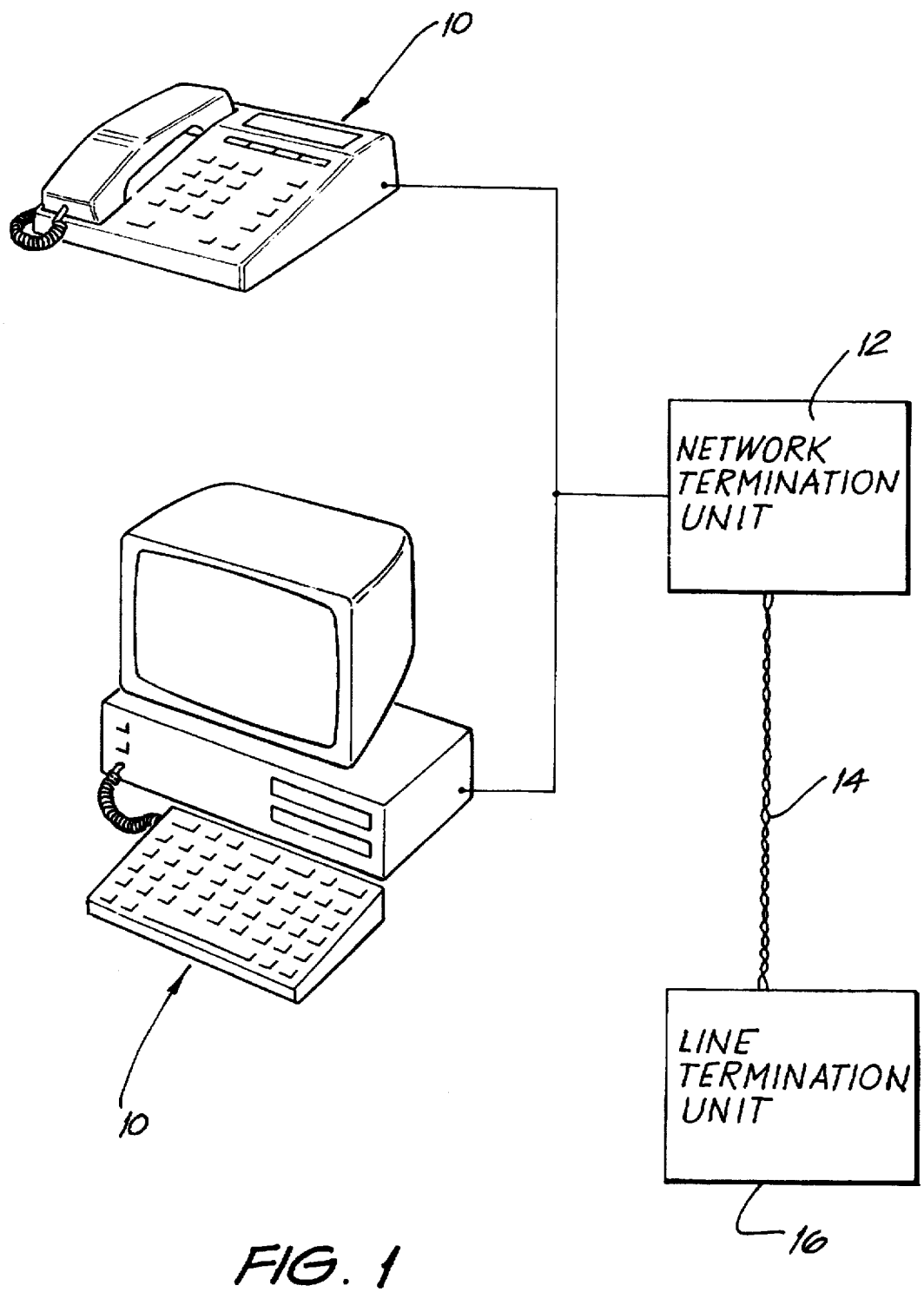
FIG. 1 is a block diagram of part of an integrated services digital network.

FIG. 1 shows a block diagram of part of an integrated services digital network in which customer's equipment 10 is connected to network termination unit 12, and network termination unit 12 is coupled via two-wire line 14 (and possibly through repeaters not shown) to line termination unit 16 in an exchange.

Faults in two-wire line 14 or termination units 12 and 16 can be caused by a large number of factors. For example, in two-wire line 14, there may be an unacceptably high attenuation at certain or all frequencies. Alternatively, or additionally, there may be crosstalk between cable pairs, impulse noise, or line balance problems. Of these problems, probably the most important is an unacceptably high attenuation. High attenuation also causes the overall performance of the line and termination units to be more susceptible to impulse noise and crosstalk. In line termination unit 16 and network termination unit 12 (which contain receivers and transmitters), faults could be caused, among other things, by low transmitter output power, low receiver input sensitivity, or internal processing problems.

If a fault exists in either two-wire line 14, network termination unit 12, or line termination unit 16, localisation of the fault involves determining which one of those integers is faulty. Localisation is particularly difficult if the fault is intermittent and occurs only under rare circumstances.

Traditional fault-finding measurements available to a technician attempting to localise such a fault usually centre on bit-error rate measurements. However, such measurements do not provide much insight into the state of the line and termination units because digital networks usually operate with very low bit-error rates, or else fail catastrophically with very large bit-error rates. Bit-error rates usually do not give an indication of how close a network is to failure. Such failure may include unacceptably high bit-error rates or loss of synchronisation of various termination units in the network.

Thus, a set of measurements is required which can give to a technician an indication of the proximity of the digital network to failure. In traditional analogue networks, such a set of measurements is provided by near-end and far-end loss measurements. In the present invention, an analogous set of measurements is defined for a digital network.

Specifically, let the worst case line attenuation allowable by the telecommunication authority be LW decibels, and let the actual attenuation introduced by two-wire line 14 be LL decibels. Then, the line margin ML is defined as ML=LW−LL. The line margin is a figure which indicates the proximity of the line attenuation to its highest allowable value. A large positive value of ML indicates a reliable line, whereas a small positive value of ML indicates a line attenuation which may cause intermittent faults, and a negative value of ML indicates a faulty line.

For a receiver (either in a line termination unit or in a network termination unit) which converts a received signal into a received data stream, let the nominal receiver failure level (or sensitivity) be SN decibels, and let the actual failure level (or sensitivity) be SA decibels, where failure is defined to occur when the bit-error rate of the received data stream is greater than a preselected rate, or when the termination units lose synchronisation. Then, the receiver margin is defined as MR=SN−SA. A positive value of MR indicates a receiver operating with adequate sensitivity, whereas a negative value of MR indicates a receiver with inadequate sensitivity.

Receiver margins are defined for both line termination unit 16 and network termination unit 12; these are denoted by MR_LT and MR_NT, respectively. The overall margin is defined as the lower of ML+MR_NT and ML+MR_LT.

The line and receiver margins provide an overall indication of transmission quality but, in contrast to bit-error rate measurements, also provide an indication of the proximity of the digital network to failure. In addition, the margins help in localising faults. For example, if ML and MR_NT are positive, but MR_LT is negative, then a fault exists in line termination unit 16. The present invention provides a means for determining these margins for a digital network.

Figure 2:
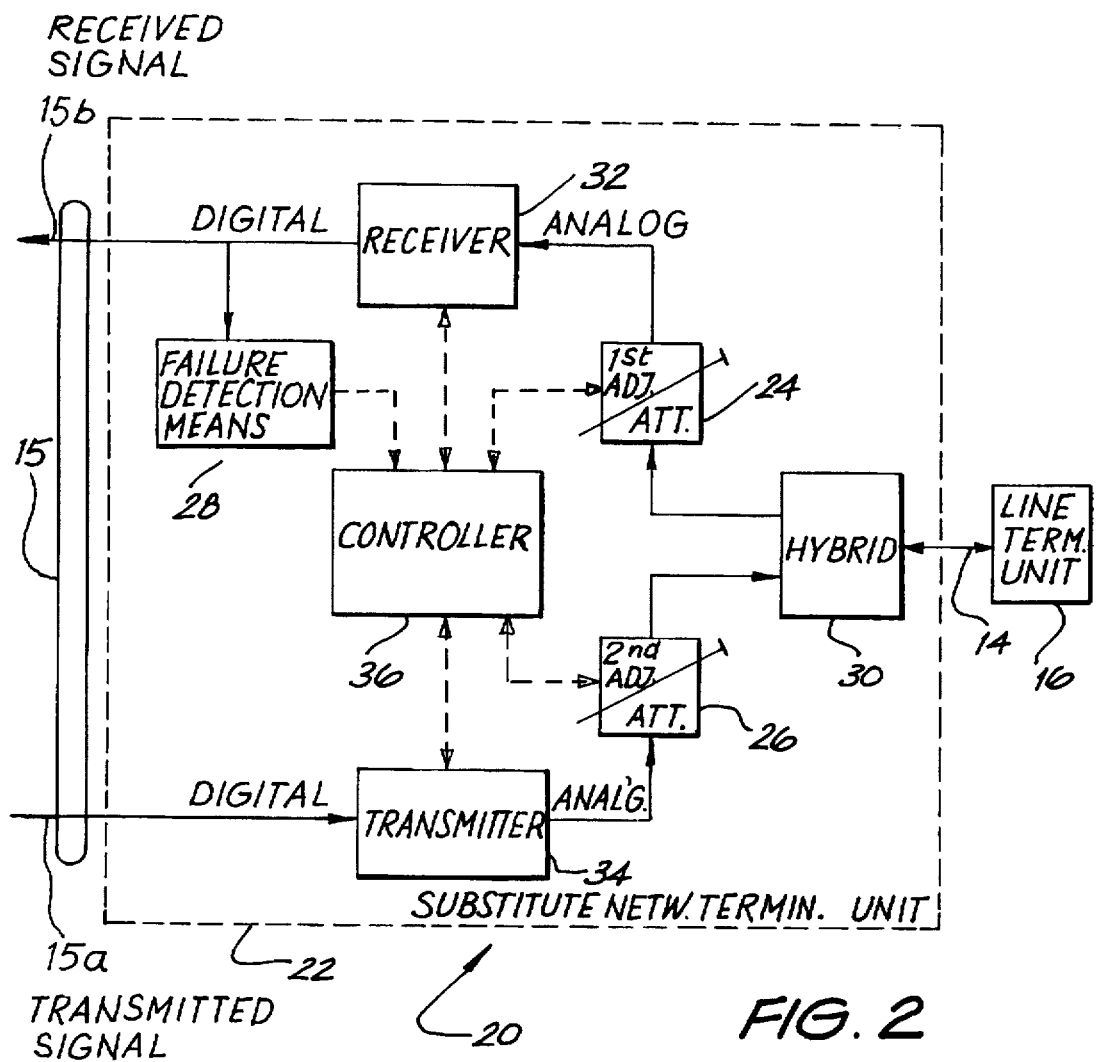
FIG. 2 is a schematic block diagram of a margin test apparatus in accordance with the present invention coupled to a line termination unit.

A preferred embodiment of a margin test apparatus for determining line and receiver margins in accordance with the present invention is shown in FIG. 2. Broadly, margin test apparatus 20 comprises substitute network termination unit 22, first adjustable attenuator 24, second adjustable attenuator 26, and failure detection means 28. Usually included in substitute network termination unit 22 is hybrid 30, receiver 32, and transmitter 34.

A four-wire line 15 carrying a transmitted signal 15a and a received signal 15b is coupled to the two-wire line 14 via the substitute network termination unit 22. Substitute network termination unit 22 includes a receive path and a transmit path.

The receive path contains first adjustable attenuator 24, receiver 32, and failure detection means 28. The input of first adjustable attenuator 24 is coupled to hybrid 30 and its output is coupled to the input of receiver 32. Receiver 32 converts a received signal in analogue form at its input to a received data stream at its output 15b. The output 15b of receiver 32 is coupled to failure detection means 28.

Failure detection means 28 may be a bit-error detector, a synchronisation loss detector, or any other means for determining that communication between termination units is unreliable. Although the following description relates primarily to an embodiment using a bit-error detector as a failure detection means, it is expressly asserted that other means for detecting communication failure can be used for margin measurement.

The transmit path contains second adjustable attenuator 26 and transmitter 34. Transmitter 34 converts a transmitted data stream 15a at its input to a transmitted signal in analogue form at its output. The output of transmitter 34 is coupled to the input of second adjustable attenuator 26, and the output of second adjustable attenuator 26 is coupled to hybrid 30.

Two-wire line 14 carries a composite analogue signal which comprises a part transmitted by margin test apparatus 20 and a part transmitted by line termination unit 16. Hybrid 30 couples two-wire line 14 to the receive path and to the transmit path, ensuring that the parts of the composite signal are passed in appropriate directions. Specifically, hybrid 30 ensures that a signal transmitted by transmitter 34 is passed substantially only to two-wire line 14 and not to receiver 32, and ensures that a signal transmitted from line termination unit 16 is passed substantially only to receiver 32 and not to transmitter 34.

First adjustable attenuator 24 can be adjusted, either manually, automatically, or under computer control, to attenuate variably and controllably the level of the received signal passed from hybrid 30 to the input of receiver 32. Although shown separately, first adjustable attenuator 24 can form an integral part of receiver 32. Similarly, second adjustable attenuator 26 can be adjusted, either manually, automatically, or under computer control, to attenuate variably and controllably the level of the transmitted signal passed from the output of transmitter 34 to hybrid 30. Although shown separately, second adjustable attenuator 26 can form an integral part of transmitter 34.

Receiver 32 is calibrated such that if the signal level at its input is greater than a predetermined threshold, then the bit-error rate of the received data stream at its output is less than a preselected rate. Conversely, if the signal level at its input is less than a predetermined threshold, then the bit-error rate of the received data stream at its output is greater than the preselected rate. The predetermined threshold is preferably chosen to be substantially equal to a nominal receiver sensitivity specified by the telecommunications authority.

Transmitter 34 is calibrated such that the transmitted signal level is substantially equal to a nominal transmission level specified by the telecommunications authority. Failure detection means 28 is coupled to the output of receiver 32 and can comprise any suitable apparatus for determining the bit-error rate of the received data stream at the output of receiver 32, or alternatively, for determining whether the bit-error rate is greater than the preselected rate. When failure detection means 28 indicates that the bit-error rate of the received data stream is greater than the preselected rate, it can be inferred that the received signal level is less than the predetermined threshold.

Control means 36 may comprise distributed logic or analogue circuitry contained in any or all of first adjustable attenuator 24, second adjustable attenuator 26, receiver 32, transmitter 34, and failure detection means 28. Alternatively, control means 36 can comprise any means, including manual control, for operating adjustable attenuators 24 and 26, and, together with failure detection means 28, for determining if the failure rate is greater than the preselected rate.

Line termination unit 16 contains a hybrid, a receiver, and a transmitter which are analogous to hybrid 30, receiver 32, and transmitter 34 in margin test apparatus 20. The output level of the transmitter in line termination unit 16 is assumed to be substantially equal to the nominal transmission level. This assumption is usually valid. If it is not valid, then the margin measurements to be described will not be accurate. However, even if the assumption is not valid, if a fault exists, then margin measurements will still help to localise the fault.

Margin measurements comprise two or more stages. First, the line margin ML is measured. Then, in either order, the line termination receiver margin MR_LT is measured and the network termination receiver margin MR_NT is measured.

The line margin ML is measured using the configuration shown in FIG. 2 as follows. Second adjustable attenuator 26 is set to introduce substantially no attenuation. Line termination unit 16 is placed in a loopback mode in which it receives signals on two-wire line 14, converts the signal to a remote received data stream, converts the remote data stream to an analogue signal and re-transmits that analogue signal at the nominal transmission level back on two-wire line 14. Line termination unit 16 could be placed in this loopback mode using a control sequence transmitted from margin test apparatus 20.

Margin test apparatus 20 transmits a test signal at the nominal transmission level to two-wire line 14, and while doing so, preferably under the control of control means 36, also increases the attenuation introduced by first adjustable attenuator 24 and monitors failure detection means 28. The attenuation is preferably increased from zero decibels (i.e., no attenuation). Eventually, the received signal level falls below the predetermined threshold, and the bit-error rate is greater than the preselected rate or the units lose synchronisation.

Failure detection means 28 detects that the bit-error rate has exceeded the preselected rate, and informs control means 36. Control means 36 then displays the introduced attenuation which corresponds to the bit-error rate being substantially equal to the preselected rate. This introduced attenuation is substantially equal to the line margin ML because the output levels of transmitter 34 and the transmitter in line termination unit 16 are assumed to be substantially equal to the nominal transmission level, and because receiver 32 is calibrated so that the bit-error rate at its output is greater than the preselected rate when the level at its input falls below the nominal receiver sensitivity.

The line termination receiver margin MR_LT is measured using the configuration shown in FIG. 2 as follows. First adjustable attenuator 24 is set to introduce substantially no attenuation. Second adjustable attenuator 26 is set to attenuate by an amount substantially equal to the line margin ML as previously measured. With these settings, the level of the transmitted signal is at a nominal level. As described in the procedure for measuring the line margin ML, line termination unit 16 is placed in a loopback mode, and margin test apparatus 20 transmits a test signal. The attenuation introduced by second adjustable attenuator 26 is then increased until failure detection means 28 indicates that the bit-error rate has exceeded the preselected rate.

Failure detection means 28 detects that the bit-error rate has exceeded the preselected rate, and informs control means 36. Control means 36 then displays the increased attenuation which corresponds to the bit-error rate being substantially equal to the preselected rate. This increased attenuation is substantially equal to the line termination receiver margin MR_LT because, with all other levels set or assumed to be equal to their nominal values, it indicates to what extent the sensitivity of the receiver in the line termination unit is greater than the nominal receiver sensitivity. That is, the difference between the nominal transmission level and the line termination receiver failure level defines the line termination receiver margin.

Figure 3:
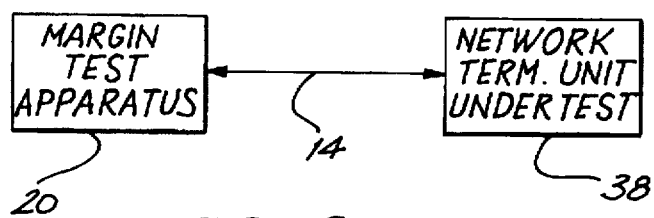
FIG. 3 is a schematic block diagram of a margin test apparatus coupled to a network termination unit under test.

The network termination receiver margin MR_MT for a network termination unit under test is measured using the configuration shown in FIG. 3 as follows. Margin test apparatus 20 is coupled via two-wire line 14 to network termination unit under test 38. First adjustable attenuator 24 is set to introduce substantially no attenuation. Second adjustable attenuator 26 is set to attenuate by an amount substantially equal to the line margin ML as previously measured. With these settings, the transmitted signal level is at a nominal local level. Network termination unit under test 38 is placed in a loopback mode, and margin test apparatus 20 transmits a test signal. The attenuation introduced by second adjustable attenuator 26 is then increased until failure detection means 28 indicates that the bit-error rate has exceeded the preselected rate.

Failure detection means 28 detects that the bit-error rate has exceeded the preselected rate, and informs control means 36. Control means 36 then displays the increased attenuation which corresponds to the bit-error rate being substantially equal to the preselected rate. This increased attenuation is substantially equal to the network termination receiver margin MR_MT because, with all other levels set or assumed to be equal to their nominal values, it indicates to what extent the sensitivity of the receiver in network termination unit under test 38 is greater than the nominal receiver sensitivity. That is, the difference between the nominal local level and the network termination receiver failure level defines the network termination receiver margin.

Thus, there has been described a margin test apparatus for use with two-wire lines and their associated termination units in an integrated services digital network. The margin test apparatus provides a technician with a set of measurements which gives intuitive insight into the state of the line and its associated termination units, and indicates the proximity to failure. In addition, the measurements can help to localise faults.

Persons skilled in the art will appreciate that numerous variations or modifications may be made to the invention as shown in the specific embodiments without departing from the spirit or scope of the invention as broadly described. The present embodiments are, therefore, to be considered in all respects as illustrative and not restrictive.

I claim:

1. A margin test apparatus for use in an integrated services digital network, the margin test apparatus comprising:
    a network termination unit including means for coupling a two-wire line to a four-wire line, the two-wire line carrying a composite signal, and the four-wire line carrying a transmitted signal and a received signal;
    a receiver for converting the received signal to a received data stream, the received signal having a level;
    a transmitter for converting a transmitted data stream to the transmitted signal;
    a failure detection means which monitors the received signal and is calibrated such that it detects a signal failure if the level of the received signal is less than a predetermined threshold level;
    a first adjustable attenuator for adjustably attenuating the received signal; and
    a second adjustable attenuator for adjustably attenuating the transmitted signal.

2. The margin test apparatus of claim 1 wherein the received data stream has a bit-error rate, and the failure detection means detects a failure when the bit-error rate is greater than a preselected rate.

3. The margin test apparatus of claim 1 wherein the failure detection means detects a failure when the network termination unit is not synchronised with a second unit.

4. A method for determining a line margin using a margin test apparatus having i) a network termination unit including means for coupling a two-wire line to a four-wire line, the two-wire line carrying a composite signal and the four-wire line carrying a transmitted signal and a received signal, ii) a first adjustable attenuator for adjustably attenuating the received signal, iii) a second adjustable attenuator for adjustably attenuating the transmitted signal, iv) a receiver for converting the received signal to a received data stream, the received signal having a level, v) a transmitter for converting a transmitted data stream to the transmitted signal, and vi) a failure detection means which monitors the received signal and is calibrated such that it detects a signal failure if the level of the received signal is less than a predetermined threshold level, the method comprising the steps of:
    coupling the two-wire line to a line termination unit;
    configuring the line termination unit such that the transmitted signal is looped back through the line termination unit to become the received signal;
    measuring the level of the received signal to determine an initial reception level;
    varying the first adjustable attenuator through a plurality of settings so that the level of the received signal passes through a plurality of attenuated reception levels;
    monitoring the failure detection means for each of the plurality of settings, thereby determining a threshold setting corresponding to a line failure level such that the network termination unit detects a failure for substantially all attenuated reception levels which are less than the line failure level, and does not detect a failure for substantially all attenuated reception levels which are greater than the line failure level;
    measuring the attenuated reception level corresponding to a threshold setting of the first adjustable attenuator, thereby determining the line failure level; and
    determining a difference between the initial reception level and the line failure level, wherein the difference defines the line margin.

5. A method for determining a line termination receiver margin using a margin test apparatus having i) a network termination unit including means for coupling a two-wire line to a four-wire line, the two-wire line carrying a composite signal and the four-wire line carrying a transmitted signal and a received signal, ii) a first adjustable attenuator for adjustably attenuating the received signal, iii) a second adjustable attenuator for adjustably attenuating the transmitted signal, iv) a receiver for converting the received signal to a received data stream, the received signal having a level, v) a transmitter for converting a transmitted data stream to the transmitted signal, and vi) a failure detection means which monitors the received signal and is calibrated such that it detects a signal failure if the level of the received signal is less than a predetermined threshold level, the method comprising the steps of:
    coupling the two-wire line to a line termination unit;
    configuring the line termination unit such that the transmitted signal is looped back through the line termination unit to become a received signal;
    measuring the level of the transmitted signal to determine a nominal transmission level;

varying the second adjustable attenuator through a plurality of settings so that the level of the transmitted signal passes through a plurality of attenuated transmission levels;

monitoring the failure detection means for each of the plurality of settings, thereby determining a threshold setting corresponding to a line termination receiver failure level such that the network termination unit detects a failure for substantially all attenuated transmission levels which are less than the line termination receiver failure level, and does not detect a failure for substantially all attenuated transmission levels which are greater than the line termination receiver failure level;

measuring the attenuated transmission level corresponding to a threshold setting of the second adjustable attenuator, thereby determining the line termination receiver failure level; and determining a difference between the nominal transmission level and the line termination receiver failure level, wherein the difference defines the line termination receiver margin.

6. A method for determining a network termination receiver margin using a margin test apparatus having i) a network termination unit including means for coupling a two-wire line to a four-wire line, the two-wire line carrying a composite signal and the four-wire line carrying a transmitted signal and a received signal, ii) a first adjustable attenuator for adjustably attenuating the received signal, iii) a second adjustable attenuator for adjustably attenuating the transmitted signal, iv) a receiver for converting the received signal to a received data stream, the received signal having a level, v) a transmitter for converting a transmitted data stream to the transmitted signal, and vi) a failure detection means which monitors the received signal and is calibrated such that it detects a signal failure if the level of the received signal is less than a predetermined threshold level, the method comprising the steps of:

coupling the two-wire line to a network termination unit under test;

configuring the network termination unit under test such that the transmitted signal is looped back through the network termination unit under test to become the received signal, the transmitted signal having a level;

measuring the level of the transmitted signal to determine a nominal local level;

varying the second adjustable attenuator through a plurality of settings so that the level of the transmitted signal passes through a plurality of attenuated transmission levels;

monitoring the failure detection means for each of the plurality of settings, thereby determining a threshold setting corresponding to a network termination receiver failure level such that the network termination unit detects a failure for substantially all attenuated transmission levels which are less than the network termination receiver failure level, and does not detect a failure for substantially all attenuated transmission levels which are greater than the network termination receiver failure level;

measuring the level of the attenuated transmitted signal corresponding to a threshold setting to determine the network termination receiver failure level; and determining a difference between the nominal local level and the network termination receiver failure level, wherein the difference defines the network termination receiver margin.

7. A margin test apparatus for use in an integrated services digital network, the margin test apparatus comprising:

a network termination unit including means for coupling a two-wire line to a four-wire line, the two-wire line carrying a composite signal, and the four-wire line carrying a transmitted signal and a received signal;

a first adjustable attenuator for adjustably attenuating the received signal;

a second adjustable attenuator for adjustably attenuating the transmitted signal;

a receiver for converting the received signal to a received data stream, the received signal having a level; and a transmitter for converting a transmitted data stream to the transmitted signal;

wherein the network termination unit is calibrated such that it detects a signal failure if the network termination unit is not synchronised with a second unit.

8. The margin test apparatus of claim 7 wherein the received data stream has a bit-error rate, and the signal failure is detected when the bit-error rate is greater than a preselected rate.

9. A method for determining a line margin using a margin test apparatus having i) a network termination unit including means for coupling a two-wire line to a four-wire line, the two-wire line carrying a composite signal and the four-wire line carrying a transmitted signal and a received signal, ii) an adjustable attenuator for adjustably attenuating the received signal, iii) a receiver for converting the received signal to a received data stream, the received signal having a level, iv) a transmitter for converting a transmitted data stream to the transmitted signal, and v) a failure detection means which monitors the received signal and is calibrated such that it detects a signal failure if the level of the received signal is less than a predetermined threshold level, the method comprising the steps of:

coupling the two-wire line to a line termination unit;

configuring the line termination unit such that the transmitted signal is looped back through the line termination unit to become the received signal;

measuring the level of the received signal to determine an initial reception level;

varying the adjustable attenuator through a plurality of settings so that the level of the received signal passes through a plurality of attenuated reception levels;

monitoring the failure detection means for each of the plurality of settings, thereby determining a threshold setting corresponding to a line failure level such that the network termination unit detects a failure for substantially all attenuated reception levels which are less than the line failure level, and does not detect a failure for substantially all attenuated reception levels which are greater than the line failure level;

measuring the attenuated reception level corresponding to a threshold setting of the adjustable attenuator, thereby determining the line failure level; and determining a difference between the initial reception level and the line failure level, wherein the difference defines the line margin.

10. A method for determining a line termination receiver margin using a margin test apparatus having i) a network termination unit including means for coupling a two-wire line to a four-wire line, the two-wire line carrying a composite signal and the four-wire line carrying a transmitted signal and a received signal, ii) an adjustable attenuator for adjustably attenuating the transmitted signal, iii) a receiver for converting the received signal to a received data stream, the received signal having a level, iv) a transmitter for converting a transmitted data stream to the transmitted signal, and v) a failure detection means which monitors the received signal and is calibrated such that it detects a signal failure if the level of the received signal is less than a predetermined threshold level, the method comprising the steps of:

coupling the two-wire line to a line termination unit;

configuring the line termination unit such that the transmitted signal is looped back through the line termination unit to become the received signal;

measuring the level of the transmitted signal to determine a nominal transmission level;

varying the adjustable attenuator through a plurality of settings so that the level of the transmitted signal passes through a plurality of attenuated transmission levels;

monitoring the failure detection means for each of the plurality of settings, thereby determining a threshold setting corresponding to a line termination receiver failure level such that the network termination unit detects a failure for substantially all attenuated transmission levels which are less than the line termination receiver failure level, and does not detect a failure for substantially all attenuated transmission levels which are greater than the line termination receiver failure level;

measuring the attenuated transmission level corresponding to a threshold setting of the adjustable attenuator, thereby determining the line termination receiver failure level; and determining a difference between the nominal transmission level and the line termination receiver failure level, wherein the difference defines the line termination receiver margin.

11. A method for determining a network termination receiver margin using a margin test apparatus having i) a network termination unit including means for coupling a two-wire line to a four-wire line, the two-wire line carrying a composite signal and the four-wire line carrying a transmitted signal and a received signal, ii) an adjustable attenuator for adjustably attenuating the transmitted signal, iii) a receiver for converting the received signal to a received data stream, the received signal having a level, iv) a transmitter for converting a transmitted data stream to the transmitted signal, and v) a failure detection means which monitors the received signal and is calibrated such that it detects a signal failure if the level of the received signal is less than a predetermined threshold level, the method comprising the steps of:

coupling the two-wire line to a network termination unit under test;

configuring the network termination unit under test such that the transmitted signal is looped back through the network termination unit under test to become the received signal, the transmitted signal having a level;

measuring the level of the transmitted signal to determine a nominal local level;

varying the adjustable attenuator through a plurality of settings so that the level of the transmitted signal passes through a plurality of attenuated transmission levels;

monitoring the failure detection means for each of the plurality of settings, thereby determining a threshold setting corresponding to a network termination receiver failure level such that the network termination unit detects a failure for substantially all attenuated transmission levels which are less than the network termination receiver failure level, and does not detect a failure for substantially all attenuated transmission levels which are greater than the network termination receiver failure level;

measuring the level of the attenuated transmitted signal corresponding to a threshold setting to determine the network termination receiver failure level; and determining a difference between the nominal local level and the network termination receiver failure level, wherein the difference defines the network termination receiver margin.

* * * * *